United States Patent
Jeong et al.

(10) Patent No.: US 12,489,050 B2
(45) Date of Patent: Dec. 2, 2025

(54) SEMICONDUCTOR DEVICE HAVING HIGH BREAKDOWN VOLTAGE CAPACITOR

(71) Applicant: SK keyfoundry Inc., Cheongju-si (KR)

(72) Inventors: Jong Yeul Jeong, Cheongju-si (KR); Sang Geun Koo, Cheongju-si (KR); Jeong Ho Sheen, Cheongju-si (KR); Kang Sup Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 408 days.

(21) Appl. No.: 18/299,281

(22) Filed: Apr. 12, 2023

(65) Prior Publication Data

US 2024/0136276 A1 Apr. 25, 2024
US 2024/0234296 A9 Jul. 11, 2024

(30) Foreign Application Priority Data

Oct. 19, 2022 (KR) .......... 10-2022-0134693

(51) Int. Cl.
*H01L 23/522* (2006.01)
*H10D 86/85* (2025.01)

(52) U.S. Cl.
CPC ......... *H01L 23/5223* (2013.01); *H10D 86/85* (2025.01); *H01L 23/5226* (2013.01)

(58) Field of Classification Search
CPC .. H01L 23/5223; H01L 23/5226; H10D 86/85
USPC .......................................................... 257/532
See application file for complete search history.

(56) References Cited

U.S. PATENT DOCUMENTS

| 10,388,852 B2 * | 8/2019 | Zheng .................. H10N 50/85 |
| 2015/0333055 A1 | 11/2015 | West et al. |
| 2016/0163785 A1 | 6/2016 | West et al. |
| 2016/0172434 A1 | 6/2016 | West et al. |
| 2017/0263696 A1 | 9/2017 | West et al. |
| 2019/0074350 A1 | 3/2019 | West et al. |

* cited by examiner

*Primary Examiner* — Tu-Tu V Ho
(74) *Attorney, Agent, or Firm* — NSIP Law

(57) ABSTRACT

A semiconductor device includes a bottom metal line and a bottom electrode disposed on a substrate, a thick inter-metal dielectric layer disposed on the bottom metal line and the bottom electrode, a first via disposed on the bottom metal line disposed in the thick inter-metal dielectric layer, a second via disposed on the first via, a top metal line disposed on the second via and overlapping the bottom metal line, a low bandgap dielectric layer disposed on the thick inter-metal dielectric layer, a hard mask layer disposed on the low bandgap dielectric layer, a top electrode disposed on the hard mask layer and overlapping the bottom electrode, and a passivation layer disposed on the top metal line and the top electrode.

17 Claims, 6 Drawing Sheets

SEMICONDUCTOR DEVICE HAVING HIGH BREAKDOWN VOLTAGE CAPACITOR

CROSS-REFERENCE TO RELATED APPLICATIONS

This application is based on and claims the benefit under 35 U.S.C. 119(a) of Korean Patent Application No. 10-2022-0134693, filed on Oct. 19, 2022 in the Korean Intellectual Property Office, the entire disclosure of which is incorporated herein by reference for all purposes.

BACKGROUND

1. Field

The following description relates to a semiconductor device having a high breakdown voltage capacitor.

2. Description of Related Art

Digital Isolators electrically separate circuits but still allow for digital signals to be transferred between them, and support high-voltage isolation ratings up to 5 kV. Digital isolators use transformers or capacitors to magnetically or capacitively couple data across an isolation barrier. Capacitive isolation employs high-voltage isolation capacitors to couple data signals across the isolation barrier. A thick oxide interlayer insulating film as the isolation barrier is incorporated into the high-voltage isolation capacitors in a semiconductor device to obtain the high voltage isolation. However, it is hard to increase the high-voltage isolation by merely increasing a thickness of the thick oxide interlayer insulating film. To increase the high-voltage isolation, low bandgap materials having a bandgap lower than the thick oxide interlayer insulating film are recently incorporated into the high-voltage isolation capacitors.

Employing the lower bandgap materials may induce undesired leakage current in a mixed analog-digital circuit region of the semiconductor device. Integration process with the high-voltage isolation capacitors is required to reduce the leakage current in the mixed analog-digital circuit region.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a semiconductor device includes a first bottom electrode and a second bottom electrode spaced apart from each other on a substrate, a thick inter-metal dielectric layer disposed on the first and second bottom electrodes, a first low bandgap dielectric layer and a second low bandgap dielectric layer overlapping the first bottom electrode and the second bottom electrode, respectively, and disposed on the thick inter-metal dielectric layer, a first hard mask layer and a second hard mask layer disposed on the first low bandgap dielectric layer and the second low bandgap dielectric layer, respectively, a first top electrode and a second top electrode disposed on the first hard mask layer and the second hard mask layer, respectively, and a passivation layer disposed on the first and second top electrodes, wherein the first and second low bandgap dielectric layers comprise materials different from a material of the thick inter-metal dielectric layer, and wherein the first and second hard mask layers comprise materials different from the materials of the first and second low bandgap dielectric layers.

The thick inter-metal dielectric layer may include a silicon oxide layer, the first and second low bandgap dielectric layers may include silicon nitride layers, and the first and second hard mask layers comprise metal nitride layers, and the metal nitride layers comprise one selected from TiN, WN, and TaN.

A first etch groove may be disposed between the first top electrode and the second top electrode, and may be disposed in the thick inter-metal dielectric layer.

The first low bandgap dielectric layer and the second low bandgap dielectric layer each may comprise at least two sub-layers, and the at least two sub-layers may comprise a first sub-low bandgap dielectric layer, and second sub-low bandgap dielectric layer disposed on the first sub-low bandgap dielectric layer.

The second sub-low bandgap dielectric layer may include a first portion having a first thickness, and a second portion thicker than the first thickness, and the second portion may overlap the first top electrode or the second top electrode.

The semiconductor device may further include a first via disposed on a bottom metal line in the thick inter-metal dielectric layer, a second via disposed on the first via, and a top metal line disposed on the second via. The second via has an upper surface higher than a lower surface of the top metal line.

The first low bandgap dielectric layer and the first hard mask layer may overlap the first top electrode but do not overlap the top metal line.

The semiconductor device may further include spacers disposed on side surfaces of the first low bandgap dielectric layer and the second low bandgap dielectric layer.

In another general aspect, a semiconductor device includes a bottom metal line and a bottom electrode disposed on a substrate, a thick inter-metal dielectric layer disposed on the bottom metal line and the bottom electrode, one or more vias disposed in the thick inter-metal dielectric layer, a low bandgap dielectric layer and a hard mask layer disposed on the thick inter-metal dielectric layer and overlapping the bottom electrode, a top metal line connected to the one or more vias, a top electrode disposed on the low bandgap dielectric layer and the hard mask layer, and a passivation layer covering the top metal line and the top electrode.

The top electrode may have a lower surface higher than a lower surface of the top metal line.

Each bandgap of the low bandgap dielectric layer and the hard mask layer may be lower than a bandgap of the thick inter-metal dielectric layer.

The semiconductor device may include spacers disposed on side surfaces of the low bandgap dielectric layer.

In another general aspect, a semiconductor device includes a bottom metal line and a bottom electrode disposed on a substrate, a thick inter-metal dielectric layer disposed on the bottom metal line and the bottom electrode, a first via disposed on the bottom metal line disposed in the thick inter-metal dielectric layer, a second via disposed on the first via, a top metal line disposed on the second via and overlapping the bottom metal line, a low bandgap dielectric layer disposed on the thick inter-metal dielectric layer, a hard mask layer disposed on the low bandgap dielectric layer, a top electrode disposed on the hard mask layer and overlapping the bottom electrode, and a passivation layer disposed on the top metal line and the top electrode.

The semiconductor device may further include spacers disposed on side surfaces of the low bandgap dielectric layer.

Each bandgap of the low bandgap dielectric layer and the hard mask layer may be lower than a bandgap of the thick inter-metal dielectric layer.

The low bandgap dielectric layer may include a first sub-low bandgap dielectric layer and a second sub-low bandgap dielectric layer disposed on the first sub-low bandgap dielectric layer.

The second sub-low bandgap dielectric layer may include a first portion, and a second portion thicker than the first portion, and the second portion may overlap the top electrode and the bottom electrode.

Other features and aspects will be apparent from the following detailed description, the drawings, and the claims.

Figure 1:
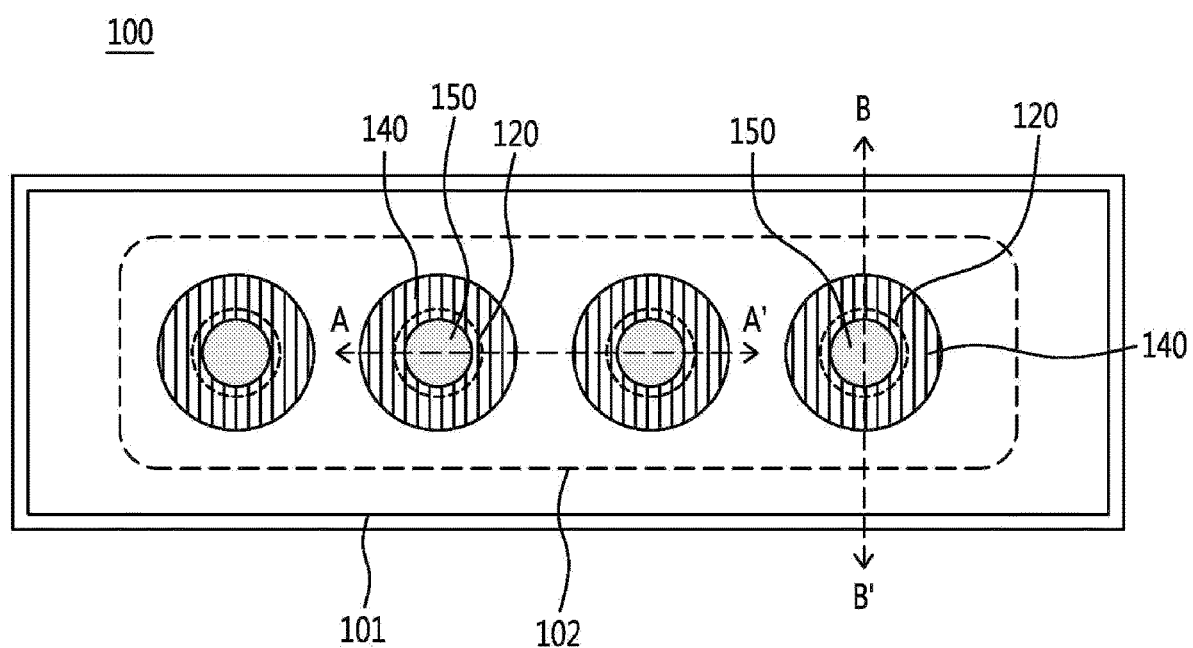
FIG. 1 illustrates a plan view of an example semiconductor device including a high breakdown voltage capacitor in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As implemented herein, the term "and/or" includes any one and any combination of any two or more of the associated listed items.

Although terms such as "first," "second," and "third" may be implemented herein to describe various members, components, regions, layers, or sections, these members, components, regions, layers, or sections are not to be limited by these terms. Rather, these terms are only implemented to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be implemented herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms implemented herein are to be interpreted accordingly.

The terminology implemented herein is for describing various examples only, and is not to be implemented to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The terms indicating a part such as "part" or portion" implemented herein to mean that the component may represent a device that may include a specific function, a software that may include a specific function, or a combination of device and software that may include a specific function, but it is not necessarily limited to the function expressed. This is only provided to help a more general understanding of one or more examples herein, Various modifications and variations are possible from these descriptions by those of ordinary skill in the art to which the one or more examples pertains.

In addition, it should be noted that all electrical signals implemented herein are examples, and when an inverter or the like is additionally provided in the circuit in accordance with one or more embodiments, the signs of all electrical signals to be described below may be reversed. Accordingly, the scope of the embodiments is not limited to the direction of the signal.

The one or more examples may solve problems related to the previously mentioned issues and provide a manufacturing method for a semiconductor device where a deep trench structure disposed between a non-volatile memory device and a logic device is effectively filled with an insulating layer.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems mentioned above. A person skilled in the relevant field of technology may understand other problems from the following description.

A detailed description is given below, with attached drawings.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates a plan view of an example semiconductor device including a high breakdown voltage capacitor in accordance with one or more embodiments.

Referring to FIG. 1, a semiconductor device 100 in accordance with one or more embodiments may include a mixed-signal integrated circuit region 101 and a high-voltage isolation capacitor region 102. The mixed-signal integrated circuit region 101 may be configured to have analog/digital signals processing area. The high-voltage isolation capacitor region 102 may be referred to as an isolation area. The high-voltage isolation capacitor region 102 is designed to have a structure capable of withstanding high voltage (or high breakdown voltage).

The high-voltage isolation capacitor region 102 includes a bottom electrode 120, a top electrode 150, a thick inter-metal dielectric layer and low bandgap dielectric layer 140 between the bottom electrode 120 and the top electrode 150.

The low bandgap dielectric layer 140 is disposed below the top electrode 150 and overlaps the top electrode 150 and may be disposed to extend beyond the top electrode 150 in a left-right direction (that is, a horizontal direction).

The high-voltage isolation capacitor region 102 includes a plurality of bottom electrodes 120 and may be disposed spaced apart from neighboring bottom electrodes 120.

Similarly, the high-voltage isolation capacitor region 102 includes a plurality of top electrodes 150 and may be disposed spaced apart from neighboring top electrodes 150.

The plurality of top electrodes 150 separated from each other may be advantageous to transfer signals with a high frequency.

In addition, the low bandgap dielectric layer 140 include a plurality of low bandgap dielectric layers 140, and they may be disposed spaced apart from neighboring low bandgap dielectric layer 140.

As illustrated in FIG. 1, the low bandgap dielectric layer 140 is not disposed in the mixed-signal integrated circuit region 101. If the low bandgap dielectric layer 140 is also disposed in the mixed-signal integrated circuit region 101, unnecessary leakage current may occur in the logic region 101 due to the low bandgap dielectric layer 140 disposed in the mixed-signal integrated circuit region 101.

Therefore, in the semiconductor device 100 in accordance with one or more embodiments of the present disclosure, the low bandgap dielectric layer 140 is disposed only in the high-voltage isolation capacitor region 102 and the low bandgap dielectric layer 140 is not disposed in the mixed-signal integrated circuit region 101.

Figure 2:
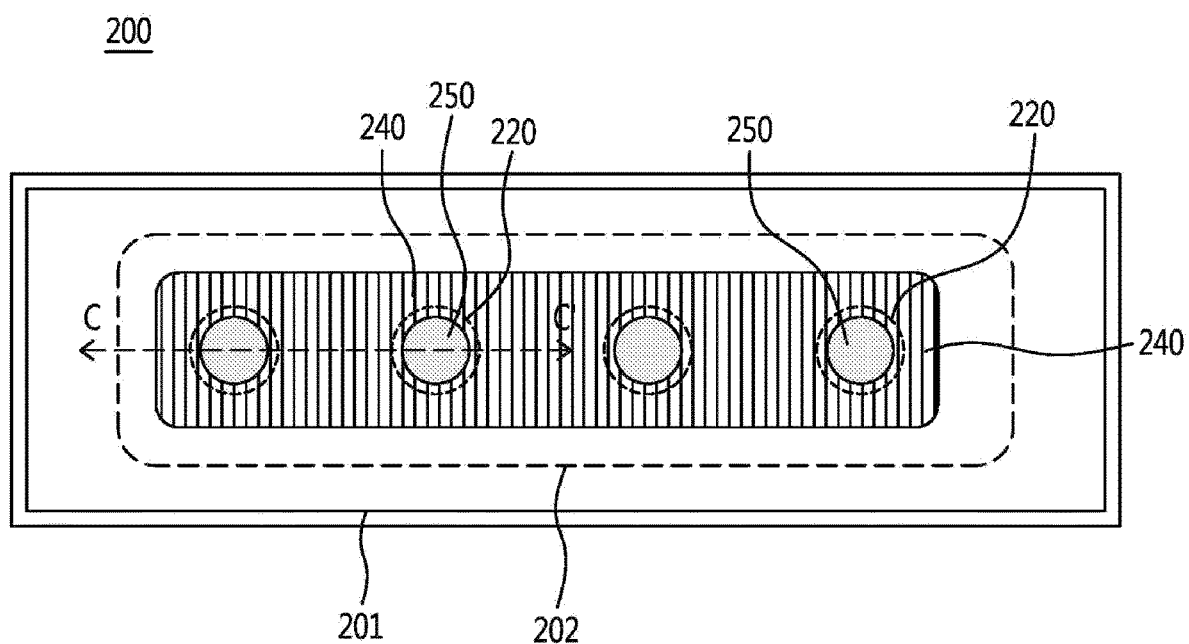
FIG. 2 illustrates a plan view of another example semiconductor device including a high breakdown voltage capacitor in accordance with one or more embodiments.

FIG. 2 illustrates a plan view of another example semiconductor device including a high breakdown voltage capacitor in accordance with one or more embodiments.

Referring to FIG. 2, a semiconductor device 200 in accordance with one or more embodiments may include a mixed-signal integrated circuit region 201 and a high-voltage isolation capacitor region 202.

The high-voltage isolation capacitor region 202 includes a plurality of bottom electrodes 220. The plurality of bottom electrodes 220 may be disposed spaced apart from other neighboring bottom electrodes 220.

The high-voltage isolation capacitor region 202 includes a plurality of top electrodes 250. The plurality of top electrodes 250 may be disposed spaced apart from other neighboring top electrodes 250.

Unlike FIG. 1, a low bandgap dielectric layer 240 has a large area and is disposed of one insulating layer. The low bandgap dielectric layer 240 is not disposed spaced apart from each other. The low bandgap dielectric layer 240 is disposed to surround both the plurality of bottom electrodes 220 and the plurality of top electrodes 250.

In addition, the low bandgap dielectric layer 240 is disposed between the plurality of bottom electrodes 220 and the top electrodes 250 to overlap the plurality of bottom electrodes 220 and the top electrodes 250 in the vertical direction, and it may be disposed to extend left and right beyond the top electrode 250 in the horizontal direction.

Figure 3:
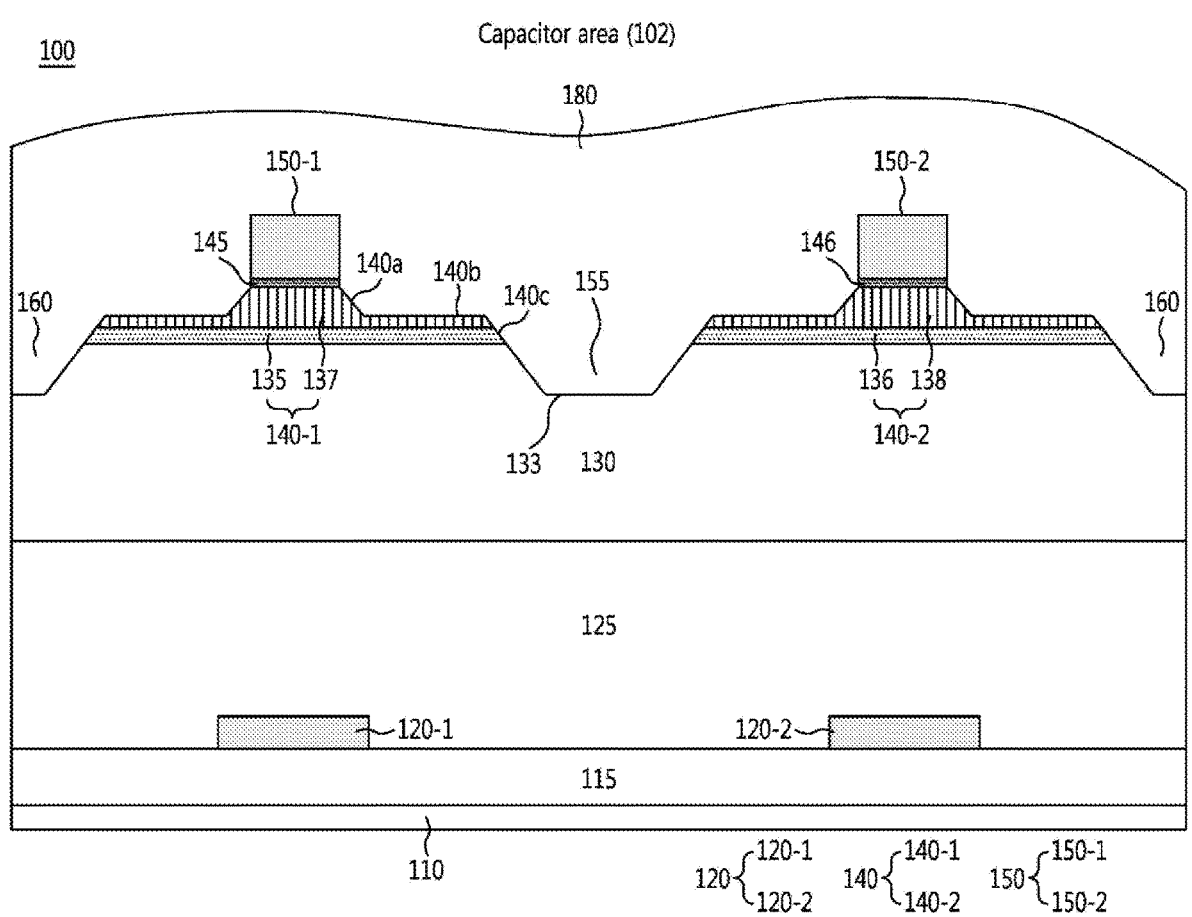
FIG. 3 illustrates a cross-sectional view of an example semiconductor device including a high breakdown voltage capacitor taken along the line A-A' of FIG. 1 in accordance with one or more embodiments.

FIG. 3 illustrates a cross-sectional view of an example semiconductor device including a high breakdown voltage capacitor taken along the line A-A' of FIG. 1 in accordance with one or more embodiments.

Hereinafter, in the description of FIG. 3, a bottom electrode 120 is described by dividing it into a first bottom electrode 120-1 and a second bottom electrode 120-2 for convenience of explanation; a low bandgap dielectric layer 140 is described by dividing it into a first low bandgap dielectric layer 140-1 and a second low bandgap dielectric layer 140-2; and a top electrode 150 is described by dividing it into a first top electrode 150-1 and a second top electrode 150-2.

Referring to FIG. 3, a semiconductor device 100 in accordance with one or more embodiments may include a first inter-metal dielectric layer 115 disposed on a substrate 110; a first bottom electrode 120-1 and a second bottom electrode 120-2 disposed on the first inter-metal dielectric layer 115; a second inter-metal dielectric layer 125 disposed on the first and second bottom electrodes 120-1, 120-2; a third inter-metal dielectric layer 130 disposed on the second inter-metal dielectric layer 125; a first low bandgap dielectric layer 140-1 and a second low bandgap dielectric layer 140-2 disposed on the third inter-metal dielectric layer 130; a first hard mask layer 145 and a second hard mask layer 146 respectively disposed on the first low bandgap dielectric layer 140-1 and the second low bandgap dielectric layer 140-2; a first top electrode 150-1 and a second top electrode 150-2 disposed on the first hard mask layer 145 and the second hard mask layer 146, respectively; and a passivation layer 180 disposed on the first and second top electrodes 150-1 and 150-2.

The first inter-metal dielectric layer 115 may comprise a TEOS oxide layer, a BPSG oxide layer, an HDP oxide layer, a USG oxide layer, a FSG oxide layer, SiOC, low-k, or the like.

The first bottom electrode 120-1 may comprise Ti, TiN, W, WN, Ta, TaN, Al, Cu, or the like.

Herein, the second and third inter-metal dielectric layers 125 and 130 are referred to as a thick inter-metal dielectric layer. The second inter-metal dielectric layer 125 may have the same material as the third inter-metal dielectric layer 130. On the other hand, the second inter-metal dielectric layer 125 may have a material different from that of the third inter-metal dielectric layer 130.

The second inter-metal dielectric layer 125 may have a stress level different from that of the third inter-metal dielectric layer 130 and does not have a wafer bow. While the second inter-metal dielectric layer 125 may have tensile stress, the third inter-metal dielectric layer 130 may have compressive stress. Alternatively, both materials of the two second inter-metal dielectric layer 125 and the third inter-metal dielectric layer 130 may have similar stress levels.

The second and third inter-metal dielectric layers 125 and 130 may include silicon oxide layers that may comprise a TEOS oxide layer, a BPSG oxide layer, a HDP oxide layer, a USG oxide layer, a FSG oxide layer, SiOC, low-k, and the like. The second and third inter-metal dielectric layers 125 and 130 may include an etch-stop layer such as SiC, SiCN, SiN, SiOCN, or the like.

Each of the first low bandgap dielectric layer 140-1 and the second low bandgap dielectric layer 140-2 may include at least two sub-layers. The at least two sub-layers may include a first sub-low bandgap dielectric layer (135, 136); and a second sub-low bandgap dielectric layer (137, 138) disposed on the first sub-low bandgap dielectric layer (135, 136).

The second sub-low bandgap dielectric layer (137, 138) includes a first portion and a second portion thicker than the first thickness. The second portion may overlap the first top electrode 150-1 or the second top electrode 150-2.

The first low bandgap dielectric layer 140-1 is disposed between the first top electrode 150-1 and the third inter-metal dielectric layer 130. The first low bandgap dielectric layer 140-1 may comprise a material different from that of the second and third inter-metal dielectric layers 125 and 130.

Specifically, the first low bandgap dielectric layer 140-1 may use a material having a lower bandgap than the second and third inter-metal dielectric layers 125 and 130.

A material with a lower bandgap allows electrical signals to travel more easily than a material with a higher bandgap. Therefore, the first low bandgap dielectric layer 140-1 transmits electrical signals well in the downward direction of the first top electrode 150-1 to which a high voltage is applied (i.e., in the direction of the first bottom electrode 120-1).

The first low bandgap dielectric layer 140-1 includes a first inclined surface 140a, a flat surface 140b, and a second inclined surface 140c. The polymer generated in the patterning process of the first top electrode 150-1 may be easily removed by the first and second inclined surfaces 140a and 140c.

The thickness of the first sub-low bandgap dielectric layer 135 is generally uniform. However, the second sub-low bandgap dielectric layer 137 may maintain a constant thickness in an area overlapping with the first top electrode 150-1, and may be disposed thinner in an area not overlapping with the first top electrode 150-1.

This is because a part of the second sub-low bandgap dielectric layer 137 located in a region that does not overlap with the first top electrode 150-1 is partially etched in the process of forming the first top electrode 150-1.

Regarding the thickness of the first low bandgap dielectric layer 140-1, the thickness of a region (first portion) where the first low bandgap dielectric layer 140-1 does not overlap with the first top electrode 150-1 is smaller than the thickness of a region (second portion) where the first low bandgap dielectric layer 140-1 overlaps with the first top electrode 150-1.

This is because the total thickness of the first low bandgap dielectric layer 140-1 is reduced by an etching process. In addition, the surface of the second low bandgap dielectric layer 130 may be partially etched by a certain thickness by the etching process.

The first and second hard mask layers 145 and 146 include metal nitride layers, and any of TiN, WN and TaN may be implemented for the metal nitride layers. Therefore, the first and second hard mask layers 145 and 146 may comprise materials different from those of the first and second low bandgap dielectric layers 140-1 and 140-2. A bandgap of the first and second hard mask layers 145 and 146 may be lower than that of the third inter-metal dielectric layer 130.

The first hard mask layer 145 may be disposed between the first low bandgap dielectric layer 140-1 and the first top electrode 150-1. The first hard mask layer 145 is a layer disposed to protect an upper portion of the first low bandgap dielectric layer 140-1 during the etching process.

The first hard mask layer 145 may comprise a metal layer or a metal nitride layer. The metal nitride layer may include titanium (Ti), titanium nitride (TiN), WN or TaN. The TiN layer may be implemented as the first hard mask layer 145 since the TiN layer has good bonding with the upper metal to be subsequently deposited.

The first and second top electrodes 150-1 and 150-2 may comprise Ti, TiN, W, WN, Ta, TaN, Al or Cu.

A first etch groove 155 may be disposed in the third inter-metal dielectric layer 130 by etching the first low bandgap dielectric layer 140-1 and the first top electrode 150-1. The first etch groove 155 may be disposed between the first top electrode 150-1 and the second top electrode 150-2 adjacent thereto.

In the first etch groove 155, the first low bandgap dielectric layer 140-1 and the second low bandgap dielectric layer 140-2 are removed. Accordingly, it can be seen that the first low bandgap dielectric layer 140-1 is disposed to be disconnected from the neighboring second low bandgap dielectric layer 140-2 by the first etch groove 155.

A second etch groove 160 may be disposed in the third inter-metal dielectric layer 130. The second etch groove 160 may be disposed between the first top electrode 150-1 and a neighboring top metal line 152 (see FIG. 4).

The second etch groove 160 also may be disposed in the third inter-metal dielectric layer 130 by a process of etching the first low bandgap dielectric layer 140-1 and the first top electrode 150-1. In the second etch groove 160, the first low bandgap dielectric layer 140-1 and the second low bandgap dielectric layer 140-2 are completely removed.

The passivation layer 180 is disposed on the first and second top electrodes 150-1 and 150-2. The passivation layer 180 may be in direct contact with the third inter-metal dielectric layer 130 through the first etch groove 155. A boundary surface 133 may be disposed between the passivation layer 180 and the third inter-metal dielectric layer 130.

Figure 4:
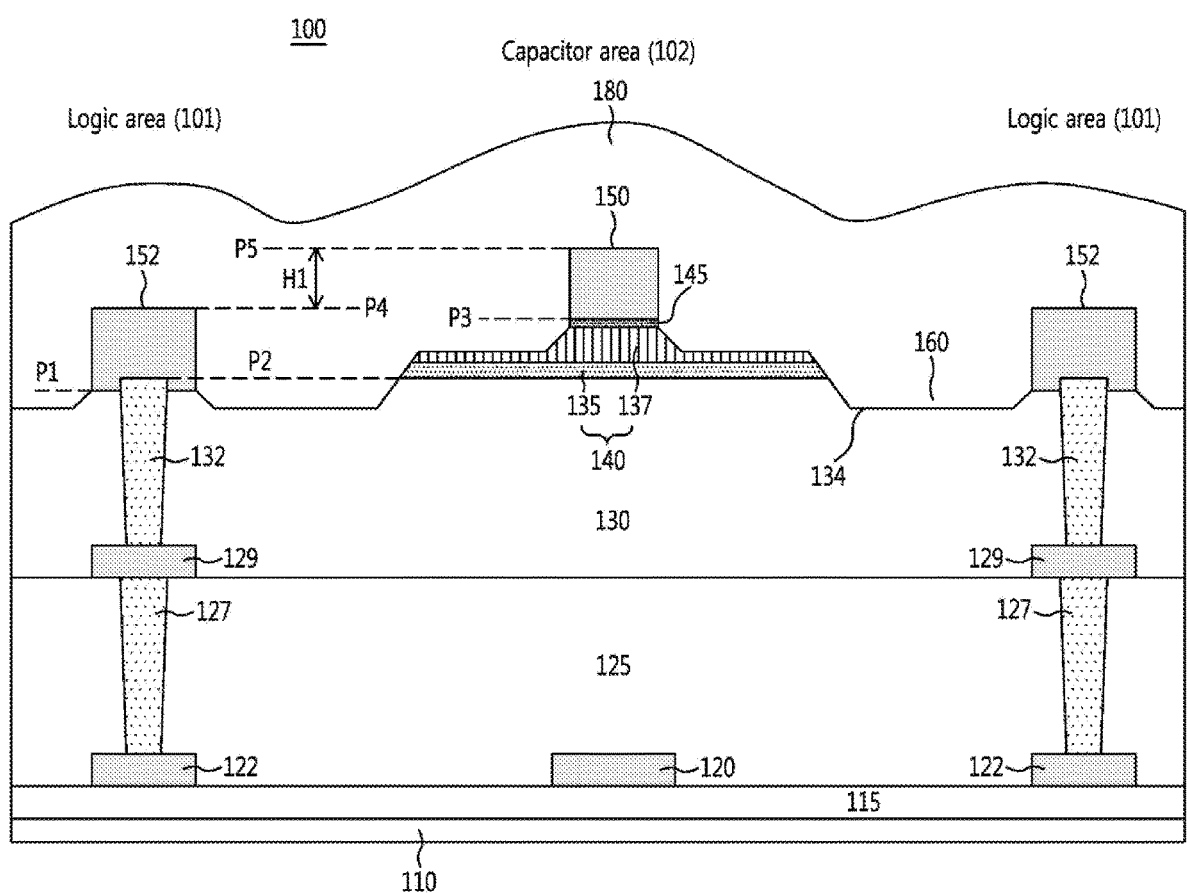
FIG. 4 illustrates a cross-sectional view of an example semiconductor device including a high breakdown voltage capacitor taken along the line B-B' of FIG. 1 in accordance with one or more embodiments.

FIG. 4 illustrates a cross-sectional view of an example semiconductor device including a high breakdown voltage capacitor taken along the line B-B' of FIG. 1 in accordance with one or more embodiments.

Referring to FIG. 4, a semiconductor device 100 in accordance with one or more embodiments includes a mixed-signal integrated circuit region 101 and a high-voltage isolation capacitor region 102.

The mixed-signal integrated circuit region 101 includes first, second and third inter-metal dielectric layers 115, 125, 130 disposed on a substrate 110; a bottom metal line 122 and a middle inter-metal line 129; a first via 127 disposed between the bottom metal-line 122 and the middle inter-metal line 129; a second via 132 disposed on the middle inter-metal line 129; and a top metal line 152 connected to the second via 132.

The high-voltage isolation capacitor region 102 includes a bottom electrode 120 disposed adjacent to the bottom metal line 122; the third inter-metal dielectric layer 130 disposed on the bottom electrode 120; a low bandgap dielectric layer 140 disposed on the third inter-metal dielectric layer 130; and a top electrode 150 disposed on the low bandgap dielectric layer 140.

The semiconductor device 100 includes a passivation layer 180 covering the low bandgap dielectric layer 140, the top metal line 152, and the top electrode 150. The passivation layer 180 may be in contact with a portion of the low bandgap dielectric layer 140, the top metal line 152, and the top electrode 150.

The low bandgap dielectric layer 140 may partially overlap the top metal line 152 in a horizontal direction as it is disposed similar to the height of the top metal line 152.

A bottom surface P2 of the low bandgap dielectric layer 140 and a top surface P2 of the second via 132 may be disposed at the same position in the horizontal direction. Accordingly, the bottom surface P2 of the low bandgap dielectric layer 140 is the same plane as the top surface P2 of the second via 132.

Accordingly, the bottom surface P1 of the top metal line 152 may be lower than the top surface P2 of the second via 132 and the bottom surface P2 of the low bandgap dielectric layer 140.

The top electrode 150 may be disposed higher than the top metal line 152. Thus, the bottom surface P1 of the top metal line 152 may be disposed lower than a bottom surface P3 of the top electrode 150. There may be a height difference by a first height H1 between a top surface P5 of the top electrode 150 and a top surface P4 of the top metal line 152.

In addition, a length of the low bandgap dielectric layer 140 that extends in a horizontal direction beyond the top electrode 150 may be greater than a thickness of the top electrode 150.

A second etch groove 160 may be disposed in the third inter-metal dielectric layer 130 by a process of etching the low bandgap dielectric layer 140 and the top electrode 150.

The second etch groove 160 may be disposed between the top electrode 150 and a neighboring top metal line 152. In the second etch groove 160, the low bandgap dielectric layer is not disposed and is completely removed.

In addition, all of the low bandgap dielectric layer under the top metal line 152 disposed in the mixed-signal integrated circuit region 101 is removed. If the low bandgap dielectric layer is disposed under the top metal line 152, unnecessary leakage current may occur.

Therefore, the low bandgap dielectric layer does not exist under the top metal line 152. In short, the top metal line 152 directly contacts the third inter-metal dielectric layer 130 and the second via 132.

Referring to FIG. 4, in the high-voltage isolation capacitor region 102, a passivation layer 180 is disposed on the plurality of top electrodes 150. The passivation layer 180 may be in direct contact with the third inter-metal dielectric layer 130 through the second etch groove 160. A lowermost surface 134 may be disposed between the passivation layer 180 and the third inter-metal dielectric layer 130.

Figure 5:
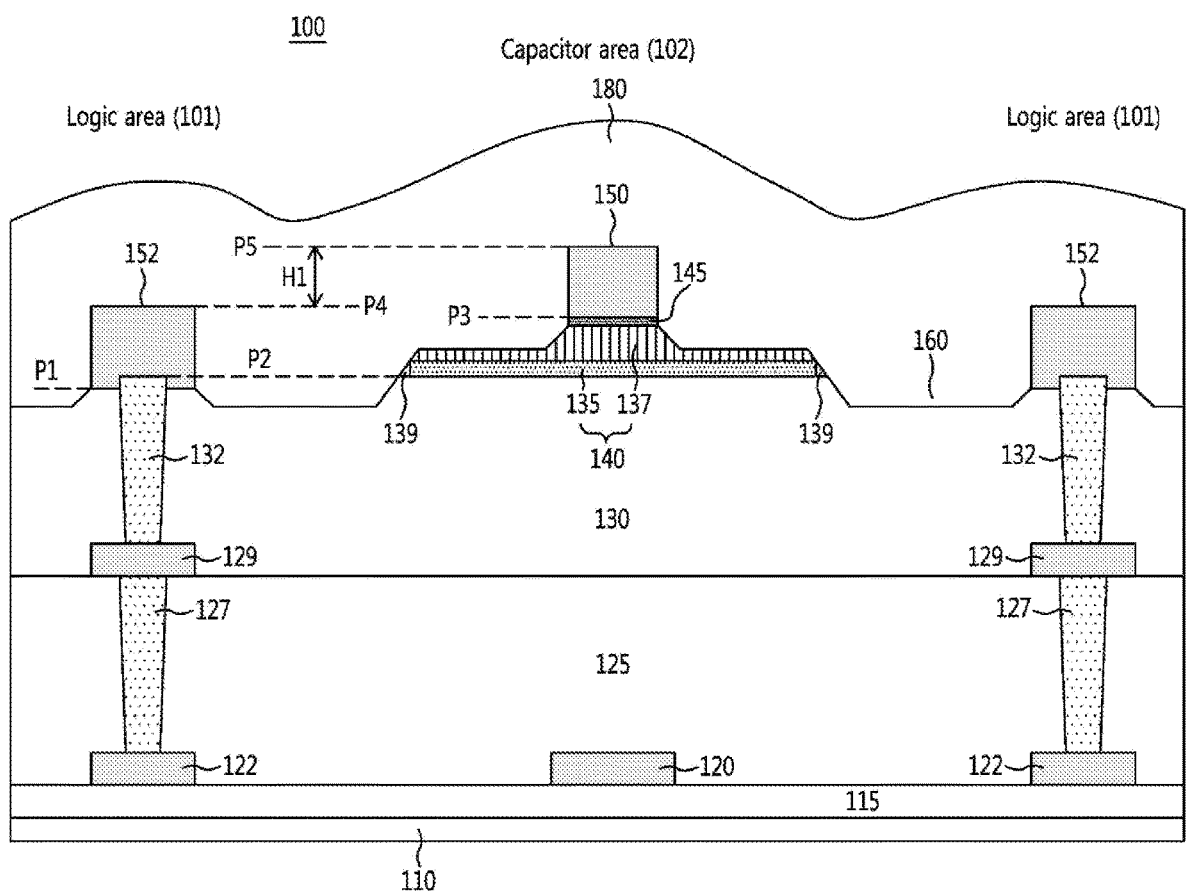
FIG. 5 illustrates a cross-sectional view of another example semiconductor device including a high breakdown voltage capacitor taken along the line B-B' of FIG. 1 in accordance with one or more embodiments.

FIG. 5 illustrates a cross-sectional view of another example semiconductor device including a high breakdown voltage capacitor taken along the line B-B' of FIG. 1 in accordance with one or more embodiments.

FIG. 5 is very similar to FIG. 4. Similar parts will be omitted from the description. The difference is that spacers 139 are disposed on side surfaces of the low bandgap dielectric layer 140. The spacers 139 may comprise a silicon oxide layer. The spacers 139 may be disposed to protect side surfaces of the low bandgap dielectric layer 140. In addition, the spacers 139 may prevent a polymer from being formed on the side surfaces of the low bandgap dielectric layer 140 when the top metal line 152 and the top electrode 150 are etched.

Figure 6:
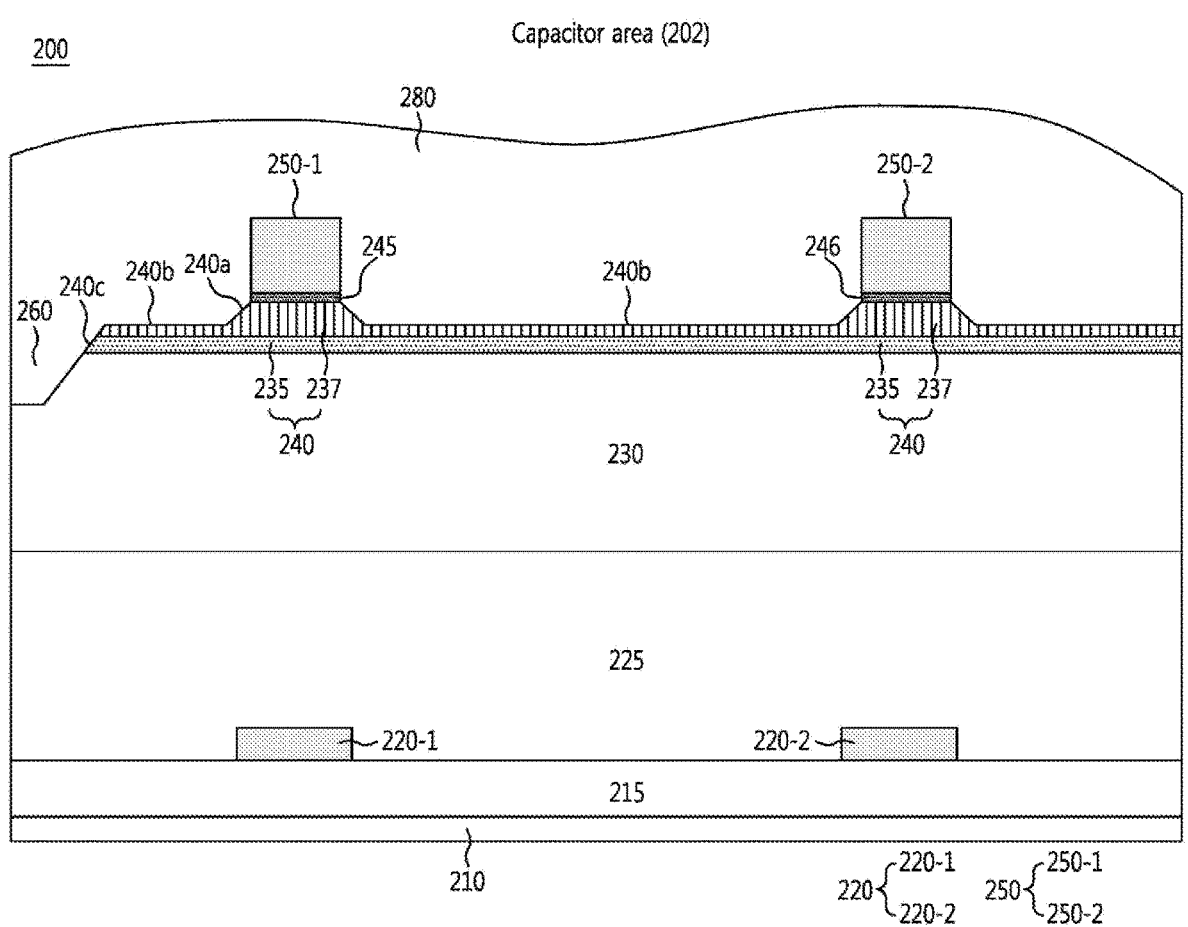
FIG. 6 illustrates a cross-sectional view of an example semiconductor device including a high breakdown voltage capacitor taken along the line C-C' of FIG. 2 in accordance with one or more embodiments.

FIG. 6 illustrates a cross-sectional view of an example semiconductor device including a high breakdown voltage capacitor taken along the line C-C' of FIG. 2 in accordance with one or more embodiments.

Hereinafter, in the description of FIG. 6, a bottom electrode 220 may include a first bottom electrode 220-1 and a second bottom electrode 220-2; and a top electrode 250 may include a first top electrode 250-1 and a second top electrode 250-2.

Referring to FIG. 6, in a semiconductor device 200 in accordance with one or more embodiments, a high-voltage isolation capacitor region 202 may include a substrate 210, a first bottom electrode 220-1, a second bottom electrode 220-2, a first inter-metal dielectric layer 215, a second inter-metal dielectric layer 225, a third inter-metal dielectric layer 230, a low bandgap dielectric layer 240, a first top electrode 250-1, a second top electrode 250-2, and a passivation layer 280.

In the semiconductor device 200, unlike the semiconductor device 100 of FIG. 3, an etch groove is not disposed between the first top electrode 250-1 and the second top electrode 250-2.

In detail, in the semiconductor device 200, as shown in FIG. 6, each low bandgap dielectric layer 240 under the first top electrode 250-1 and the second top electrode 250-2 extends to be connected to each other. In other words, it can be understood that the low bandgap dielectric layer 240 is not disconnected between the first top electrode 250-1 and the second top electrode 250-2.

Referring to FIG. 6, the low bandgap dielectric layer 240 includes at least two sub-low bandgap dielectric layers 235 and 237. The low bandgap dielectric layer 240 includes a first inclined plane 240a, a flat plane 240b, and a second inclined plane 240c.

The thickness of the first-sub low bandgap dielectric layer 235 is generally uniform. The second-sub low bandgap dielectric layer 237 may maintain the thickness constant in the region overlapping the top electrode 250 and may be disposed thinner in the region not overlapping the top electrode 250. This is because a portion of the second-sub low bandgap dielectric layer 237 present in the region that does not overlap with the top electrode 250 is partially etched in the process of forming the top electrode 250.

Hereinafter, a manufacturing process of a semiconductor device having a high breakdown voltage capacitor will be described. A manufacturing process will be described in detail below using the semiconductor device 100 of FIGS. 1 and 3 to 5 as an example. However, the following manufacturing process may be applied in the same or similar manner to manufacturing the semiconductor device 200 of FIGS. 2 and 6. In addition, the same reference numerals are implemented for a specific configuration and a configuration disposed by removing (i.e., patterning) a part of the specific configuration. For example, a low bandgap dielectric layer and a low bandgap dielectric layer pattern disposed by patterning the low bandgap dielectric layer will be denoted by the same reference numerals.

As described above, a semiconductor device including a high breakdown voltage capacitor and a manufacturing method thereof in accordance with one or more embodiments may prevent (or minimize) unwanted leakage current from occurring in other parts (i.e., mixed-signal integrated circuit region) by forming a low bandgap dielectric layer for providing high breakdown voltage (or ultra-high breakdown voltage) characteristics only to a desired part (i.e., high-voltage isolation capacitor region).

In addition, a semiconductor device including a high breakdown voltage capacitor and a manufacturing method thereof in accordance with one or more embodiments may allow to simplify the manufacturing method of a semiconductor device, reduce manufacturing costs by eliminating unnecessary processes, and optimize the structure of a semiconductor device by not forming an unnecessary low bandgap dielectric layer in the semiconductor device. Further, a semiconductor device including a high breakdown voltage capacitor and a manufacturing method thereof in accordance with one or more embodiments may prevent (or minimize) loss of the low bandgap dielectric layer with a low bandgap by using a hard mask insulating layer on the low bandgap dielectric layer with a low bandgap.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a first bottom electrode and a second bottom electrode spaced apart from each other on a substrate;
   a thick inter-metal dielectric layer disposed on the first and second bottom electrodes;
   a first low bandgap dielectric layer and a second low bandgap dielectric layer overlapping the first bottom electrode and the second bottom electrode, respectively, and disposed on the thick inter-metal dielectric layer;
   a first hard mask layer and a second hard mask layer disposed on the first low bandgap dielectric layer and the second low bandgap dielectric layer, respectively;
   a first top electrode and a second top electrode disposed on the first hard mask layer and the second hard mask layer, respectively; and
   a passivation layer disposed on the first and second top electrodes,
   wherein the first and second low bandgap dielectric layers comprise materials different from a material of the thick inter-metal dielectric layer, and
   wherein the first and second hard mask layers comprise materials different from the materials of the first and second low bandgap dielectric layers.

2. The semiconductor device of claim 1, wherein the thick inter-metal dielectric layer comprises a silicon oxide layer,
   wherein the first and second low bandgap dielectric layers comprise silicon nitride layers, and
   wherein the first and second hard mask layers comprise metal nitride layers, and the metal nitride layers comprise one selected from TiN, WN, and TaN.

3. The semiconductor device of claim 1, wherein a first etch groove is disposed between the first top electrode and the second top electrode and is disposed in the thick inter-metal dielectric layer.

4. The semiconductor device of claim 1, wherein the first low bandgap dielectric layer and the second low bandgap dielectric layer each comprise at least two sub-layers, and
   wherein the at least two sub-layers comprise:
   a first sub-low bandgap dielectric layer; and
   a second sub-low bandgap dielectric layer disposed on the first sub-low bandgap dielectric layer.

5. The semiconductor device of claim 4, wherein the second sub-low bandgap dielectric layer comprises:
   a first portion having a first thickness; and
   a second portion thicker than the first thickness, and
   wherein the second portion overlaps the first top electrode or the second top electrode.

6. The semiconductor device of claim 1, further comprising:
   a first via disposed on a bottom metal line in the thick inter-metal dielectric layer;
   a second via disposed on the first via; and
   a top metal line disposed on the second via,
   wherein the second via has an upper surface higher than a lower surface of the top metal line.

7. The semiconductor device of claim 6, wherein the first low bandgap dielectric layer and the first hard mask layer overlap the first top electrode but do not overlap the top metal line.

8. The semiconductor device of claim 1, further comprising:

spacers disposed on side surfaces of the first low bandgap dielectric layer and the second low bandgap dielectric layer.

9. A semiconductor device comprising:
a bottom metal line and a bottom electrode disposed on a substrate;
a thick inter-metal dielectric layer disposed on the bottom metal line and the bottom electrode;
one or more vias disposed in the thick inter-metal dielectric layer;
a low bandgap dielectric layer and a hard mask layer disposed on the thick inter-metal dielectric layer and overlapping the bottom electrode;
a top metal line connected to the one or more vias;
a top electrode disposed on the low bandgap dielectric layer and the hard mask layer; and
a passivation layer covering the top metal line and the top electrode.

10. The semiconductor device of claim 9, wherein the top electrode has a lower surface higher than a lower surface of the top metal line.

11. The semiconductor device of claim 9, wherein each bandgap of the low bandgap dielectric layer and the hard mask layer is lower than a bandgap of the thick inter-metal dielectric layer.

12. The semiconductor device of claim 9, further comprising:
spacers disposed on side surfaces of the low bandgap dielectric layer.

13. A semiconductor device comprising:
a bottom metal line and a bottom electrode disposed on a substrate;
a thick inter-metal dielectric layer disposed on the bottom metal line and the bottom electrode;
a first via disposed on the bottom metal line disposed in the thick inter-metal dielectric layer;
a second via disposed on the first via;
a top metal line disposed on the second via and overlapping the bottom metal line;
a low bandgap dielectric layer disposed on the thick inter-metal dielectric layer;
a hard mask layer disposed on the low bandgap dielectric layer;
a top electrode disposed on the hard mask layer and overlapping the bottom electrode; and
a passivation layer disposed on the top metal line and the top electrode.

14. The semiconductor device of claim 13, further comprising:
spacers disposed on side surfaces of the low bandgap dielectric layer.

15. The semiconductor device of claim 13, wherein each bandgap of the low bandgap dielectric layer and the hard mask layer is lower than a bandgap of the thick inter-metal dielectric layer.

16. The semiconductor device of claim 13, wherein the low bandgap dielectric layer comprises a first sub-low bandgap dielectric layer, and a second sub-low bandgap dielectric layer disposed on the first sub-low bandgap dielectric layer.

17. The semiconductor device of claim 16, wherein the second sub-low bandgap dielectric layer comprises a first portion, and a second portion thicker than the first portion, and
wherein the second portion overlaps the top electrode and the bottom electrode.

* * * * *